(12) United States Patent
Liao

(10) Patent No.: US 6,381,140 B1
(45) Date of Patent: Apr. 30, 2002

(54) MEMORY MODULE

(75) Inventor: Sheng-Chi Liao, Taipei (TW)

(73) Assignee: Witek Enterprise Co., Ltd., Taipei (TW)

( * ) Notice: Subject to any disclaimer, the term of this patent is extended or adjusted under 35 U.S.C. 154(b) by 0 days.

(21) Appl. No.: 09/385,273

(22) Filed: Aug. 30, 1999

(51) Int. Cl.[7] ................................................. H05K 7/00
(52) U.S. Cl. ..................... 361/729; 361/719; 361/721; 361/684
(58) Field of Search ................................. 361/729, 684, 361/719, 720, 721, 735, 748, 749, 760

(56) References Cited

U.S. PATENT DOCUMENTS

| | | | | |
|---|---|---|---|---|
| 5,117,282 A | * | 5/1992 | Salatino | 357/81 |
| 5,191,404 A | * | 3/1993 | Wu et al. | 257/724 |
| 5,224,023 A | * | 6/1993 | Smith et al. | 361/412 |
| 5,754,409 A | * | 5/1998 | Smith | 361/803 |
| 5,949,657 A | * | 9/1999 | Karabatsos | 361/803 |
| 6,021,048 A | * | 2/2000 | Smith | 361/736 |
| 6,147,870 A | * | 11/2000 | Pommer | 361/746 |

* cited by examiner

Primary Examiner—Jeffrey Gaffin
Assistant Examiner—Hung Bui
(74) Attorney, Agent, or Firm—Ladas & Parry

(57) ABSTRACT

A memory module includes parallel first and second printed circuit boards, each having a mounting edge, a chip mounting side with a set of memory chips mounted thereon, and signal traces that extend from the mounting edge and that are connected to the set of memory chips on the chip mounting side. A signal conductor unit is disposed between the first and second printed circuit boards, and interconnects the signal traces on the first and second printed circuit boards.

4 Claims, 3 Drawing Sheets

MEMORY MODULE

BACKGROUND OF THE INVENTION

1. Field of the Invention

The invention relates to a memory module, more particularly to a memory module that enables fast signal transmission speeds, that has a relatively small printed circuit board height requirement, and that can be implemented at a relatively low cost.

2. Description of the Related Art

Memory devices are important components of a personal computer. Aside from their use in the storage of computer software applications, memory devices are also used for storing data of files that are being processed by the computer.

As the processing speeds of central processing units on computer main boards increase, the timing cycles of peripheral devices, such as bus timing cycles, must be increased accordingly for efficient operation of the entire computer system. During operation, the operating efficiency is affected by the access speed of memory modules when transferring or processing large blocks of data. Thus, in the PC100 standard set by manufacturers, the response time of memory devices must be at least less than 8 ns to ensure stable operation of a computer system that uses a central processing unit with a processing speed of at least 100 MHz.

Referring to FIG. 1, a conventional memory module is shown to include a printed circuit board 1 having opposite sides 11, 12, and a plurality of memory chips 10. Each side 11, 12 of the printed circuit board 1 has a lower chip mounting portion 14, an upper chip mounting portion 15, and signal traces 13 that extend from a mounting edge of the printed circuit board 1 to the lower and upper chip mounting portions 14, 15. The memory chips 10 are mounted on the opposite sides 11, 12 of the printed circuit board 1 at the lower and upper chip mounting portions 14, 15. As shown in FIG. 2, since the memory chips 10 on the upper chip mounting portion 15 are disposed farther from the mounting edge of the printed circuit board 1 than those on the lower chip mounting portion 14, a time delay normally results. In general, the time delay associated with a transmission distance of one inch is about 200 ps. Since the range of time delay that can be accommodated by a central processing unit is usually less than 1 ns, a relatively long time delay generated by a memory module will have an adverse effect on the operation of the central processing unit.

Furthermore, with reference to FIG. 3, when the conventional memory module is mounted on an electrical connector 2, because the memory chips 10 are arranged in lower and upper rows on the lower and upper chip mounting portions 14, 15 of the printed circuit board 1, the conventional memory module has a relatively large printed circuit board height requirement, thereby resulting in a corresponding increase in the height requirement of the housing of the computer to which the memory module is applied. This increase in the height requirement of the computer housing is detrimental when the computer is a notebook computer.

While stacked memory modules have been proposed heretofore to overcome the aforesaid drawback associated with time delay, they are costly to implement.

SUMMARY OF THE INVENTION

Therefore, the object of the present invention is to provide a memory module that enables fast signal transmission speeds, that has a relatively small printed circuit board height requirement, and that can be implemented at a relatively low cost.

According to the present invention, a memory module comprises: parallel first and second printed circuit boards, each having a mounting edge, a chip mounting side with a set of memory chips mounted thereon, and signal traces that extend from the mounting edge and that are connected to the set of memory chips on the chip mounting side; and a signal conductor unit that is disposed between the first and second printed circuit boards and that interconnects the signal traces on the first and second printed circuit boards.

In the preferred embodiment, the signal conductor unit includes a plurality of conductive pins that extend transversely between the first and second printed circuit boards and that connect a respective one of the signal traces on the first printed circuit board to a respective one of the signal traces on the second printed circuit board. The conductive pins space apart the first and second printed circuit boards. The memory chips on the chip mounting side are arranged in a single row, and the signal traces on the first and second printed circuit boards are identical.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
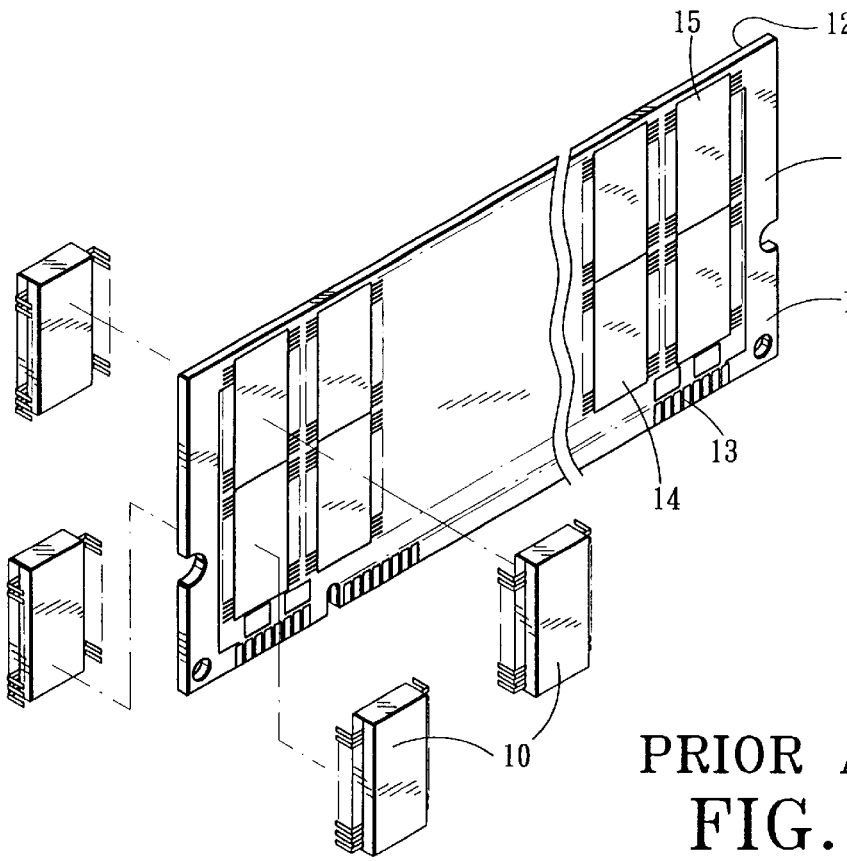
FIG. 1 is an exploded perspective view showing a conventional memory module.
Figure 2:
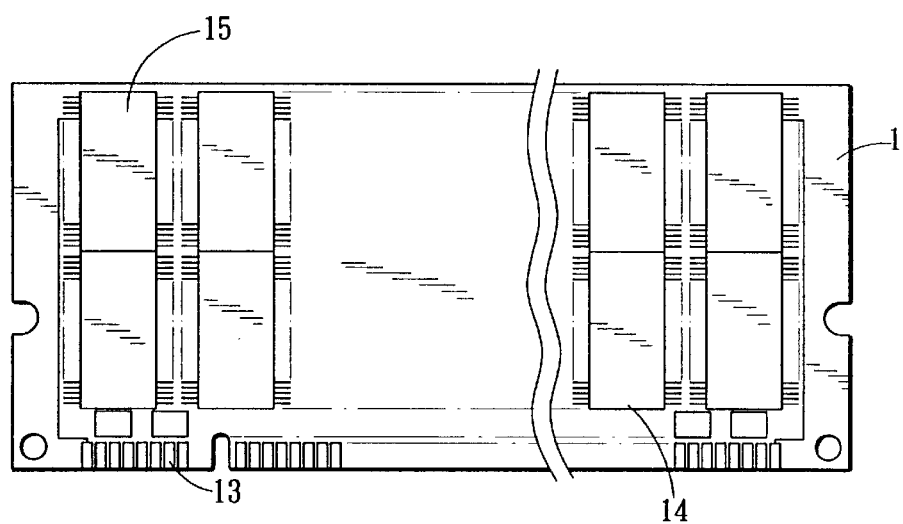
FIG. 2 is a schematic side view illustrating a printed circuit board of the conventional memory module of FIG. 1.
Figure 3:
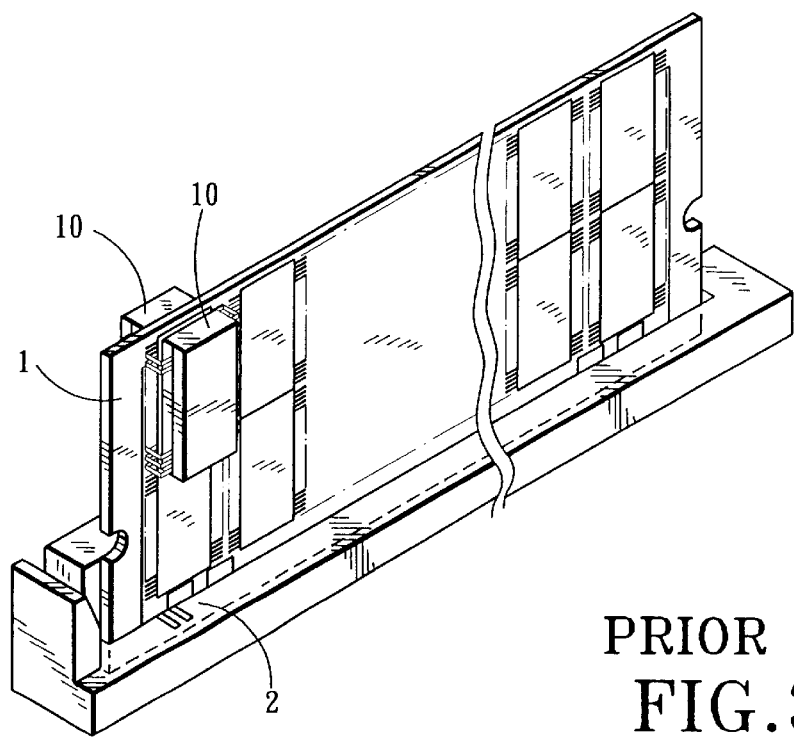
FIG. 3 is a perspective view illustrating the conventional memory module of FIG. 1 when mounted on an electrical connector.
Figure 4:
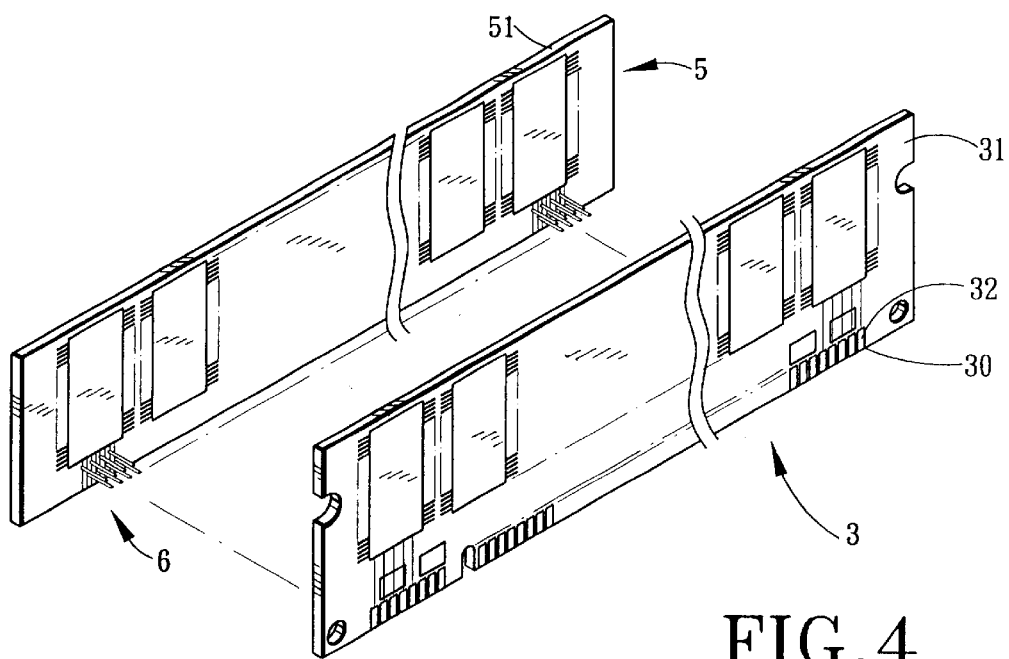
FIG. 4 is an exploded perspective view illustrating first and second printed circuit boards and a signal conductor unit of the preferred embodiment of a memory module according to the present invention.
Figure 5:
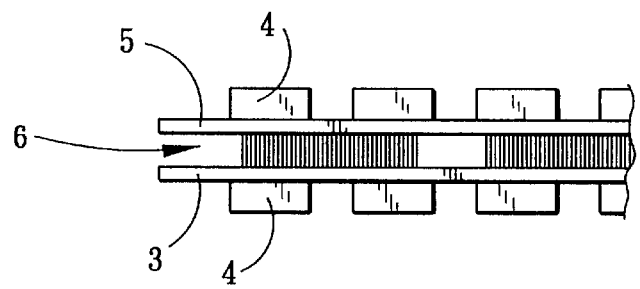
FIG. 5 is a schematic top view of the preferred embodiment.
Figure 6:
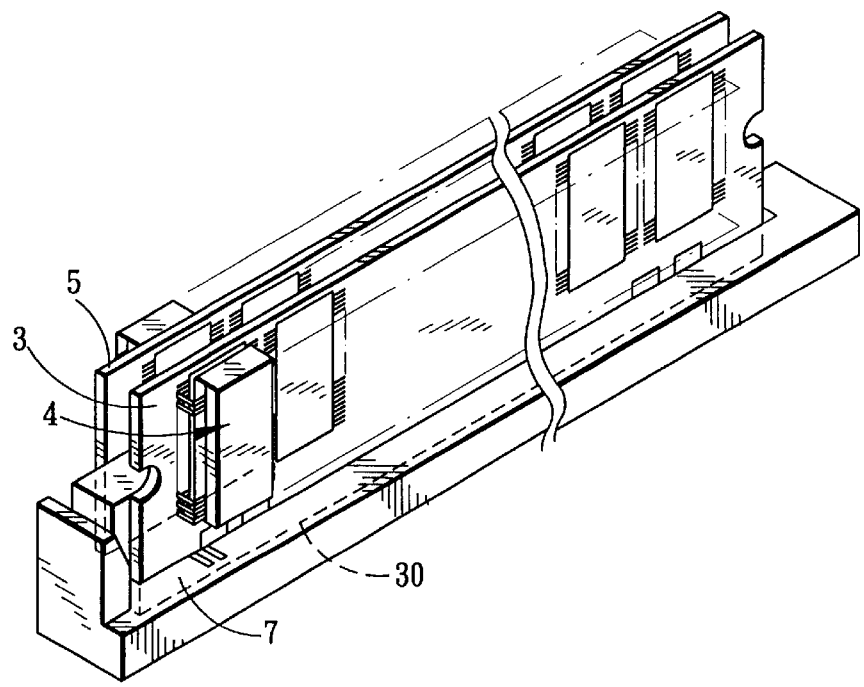
FIG. 6 is a perspective view illustrating the preferred embodiment when mounted on an electrical connector.

Referring to FIGS. 4 to 6, the preferred embodiment of a memory module according to the present invention is adapted to be mounted on an electrical connector 7 on a computer main board (not shown), and is shown to comprise first and second printed circuit boards 3, 5, first and second sets of memory chips 4, and a signal conductor unit 6.

The first printed circuit board 3 has a mounting edge 30 that is adapted to be inserted into the electrical connector 7, a chip mounting side 31 with the first set of memory chips 4 mounted thereon in a single row, and signal traces 32 that extend from the mounting edge 30 and that are connected to the first set of memory chips 4.

The second printed circuit board 5 is disposed parallel to the first printed circuit board 3, and is identical to the first printed circuit board 3 in construction. That is, the second printed circuit board 5 also has a mounting edge that is adapted to be inserted into the electrical connector 7, a chip mounting side 51 with the second set of memory chips 4 mounted thereon in a single row, and signal traces (not visible) that extend from the mounting edge, that are connected to the second set of memory chips 4, and that are identical to the signal traces 32 on the first printed circuit board 3.

The signal conductor unit 6 interconnects the signal traces of the first and second printed circuit boards 3, 5 such that the first and second sets of memory chips 4 are connected in parallel when the memory module is mounted on the electrical connector 7. In this embodiment, the signal conductor unit 6 includes a plurality of conductive pins that extend transversely between the first and second printed circuit boards 3, 5 to space apart the first and second printed circuit boards 3, 5. The conductive pins connect a respective one of the signal traces on the first printed circuit board 3 to a respective one of the signal traces on the second printed circuit board 5.

Because the first and second sets of memory chips 4 are spaced apart by the same distance from the mounting edge of the respective one of the first and second printed circuit boards 3, 5, the first and second sets of memory chips 4 can be accessed at the same time when the memory module of this invention is mounted on the electrical connector 7, thereby overcoming the drawback of time delay commonly associated with the conventional memory module described beforehand to increase the processing speed and improve the processing efficiency.

In addition, because only a single row of memory chips 4 is mounted on the chip mounting side of each of the printed circuit boards 3, 5, the printed circuit board height requirement of the memory module of this invention can be dramatically reduced, thus making it ideal for notebook computer applications.

It is noted that the number of printed circuit boards can be increased to accommodate a greater number of memory chips 4, thereby enabling the memory module of this invention to acquire a larger memory capacity.

It has thus been shown that the memory module of this invention enables fast signal transmission speeds, has a relatively small printed circuit board height requirement, and can be implemented at a relatively low cost. The object of the present invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A memory module comprising:

parallel first and second printed circuit boards, each of the first and second printed circuit boards having a mounting edge, a chip mounting side for a set of memory chips to be mounted thereon, and signal traces that extend from said mounting edge for connection to said set of memory chips; and a signal conductor unit for disposal between said first and second printed circuit boards interconnecting said signal traces, wherein said signal conductor unit includes a plurality of conductive pins that extend transversely between said first and second printed circuit boards and respectively connect said signal traces on said first printed circuit board to said signal traces on said second printed circuit board.

2. The memory module as claimed in claim 1, wherein said conductive pins space apart said first and second printed circuit boards.

3. The memory module as claimed in claim 1, wherein said set of memory chips are arranged in a single row.

4. The memory module as claimed in claim 1, wherein said signal traces on said first and second printed circuit boards are identical.

* * * * *